(12) United States Patent
Kuan et al.

(10) Patent No.: US 8,456,815 B2
(45) Date of Patent: Jun. 4, 2013

(54) ELECTRONIC DEVICE WITH FIXING ELEMENT

(75) Inventors: Chang-Ming Kuan, New Taipei (TW); Ming-Chien Chiu, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 168 days.

(21) Appl. No.: 13/069,391

(22) Filed: Mar. 23, 2011

(65) Prior Publication Data

US 2012/0014046 A1  Jan. 19, 2012

(30) Foreign Application Priority Data

Jul. 15, 2010 (CN) .......................... 2010 2 0259527

(51) Int. Cl.
 *H05K 5/00* (2006.01)
 *H05K 7/00* (2006.01)
 *H04M 1/00* (2006.01)

(52) U.S. Cl.
 USPC ............ 361/679.01; 361/679.02; 361/679.44; 361/679.57; 361/679.58; 455/575.1

(58) Field of Classification Search
 USPC ............ 361/679.01, 679.02, 679.08, 679.09, 361/679.3, 679.55–679.59; 248/351–353, 248/354.1–354.7, 468–474, 274.1, 176.1; 455/575.1–575.4; 40/747–754, 390–530
 See application file for complete search history.

(56) References Cited

U.S. PATENT DOCUMENTS

2005/0288071 A1* 12/2005 Wu ............................. 455/575.1

* cited by examiner

*Primary Examiner* — Zachary M Pape
*Assistant Examiner* — Jerry Wu
(74) *Attorney, Agent, or Firm* — Altis Law Group, Inc.

(57) ABSTRACT

An electronic device includes an enclosure and a fixing member. The enclosure includes a bottom wall configured with a plurality of positioning posts. Each of the positioning posts includes a hook and a base connecting between the hook and the bottom wall. The fixing member includes a positioning portion. The positioning portion defines an engaging hole and a plurality of positioning teeth configured on an inner edge of the positioning portion. The positioning teeth surround and communicate with the engaging hole. The positioning teeth and the engaging hole cooperatively form a passageway through which the positioning posts pass. The enclosure is configured to be positioned at different angles relative to the fixing member due to friction between the positioning teeth of the positioning portion and the base as well as tight attachment of the hook to the positioning portion.

17 Claims, 4 Drawing Sheets

US 8,456,815 B2

ELECTRONIC DEVICE WITH FIXING ELEMENT

BACKGROUND

1. Technical Field

The present disclosure relates to electronic devices, and more particularly to an electronic device with a fixing element.

2. Description of Related Art

Many electronic devices, such as IP phones, or LCD TVs, are mounted on walls by use of bolts or other fasteners. Generally, these electronic devices are configured with a groove and the bolts or fasteners pass through the groove and fix the electronic devices to the walls. In this way, the electronic devices cannot rotate relative to the walls, thereby cannot meet various requirements for users.

Therefore, there is a room for improvement within the art.

DETAILED DESCRIPTION

Figure 1:
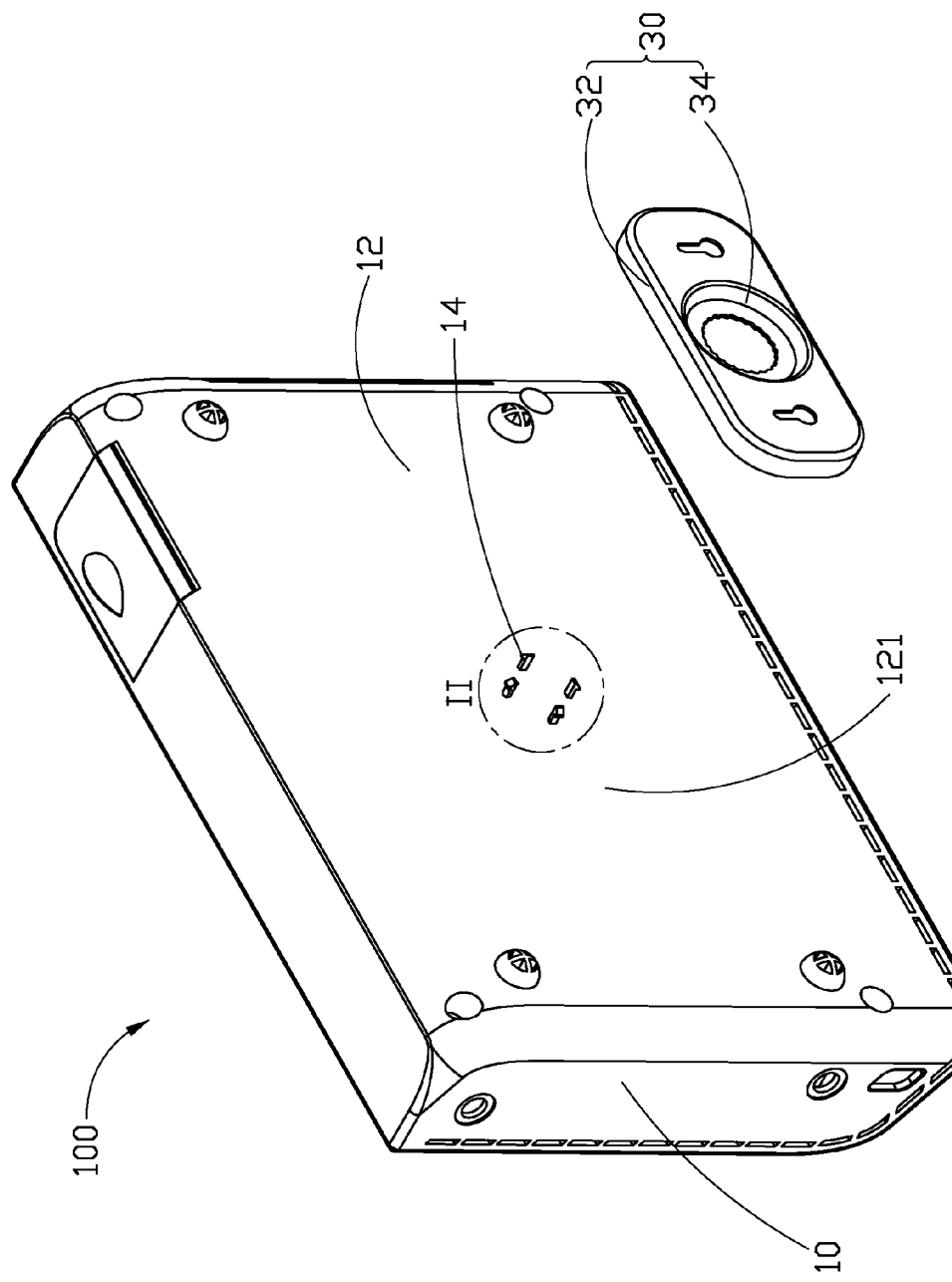
FIG. 1 is an exploded, isometric view of an electronic device of an exemplary embodiment of the disclosure.

Referring to FIG. 1, an exploded electronic device 100 of an exemplary embodiment of the present disclosure is illustrated. The electronic device 100 includes an enclosure 10 and a fixing member 30. The electronic device 100 may be but not limited to a phone, a router, a switch, or an LCD TV, for example.

The enclosure 10 accommodates electronic components, such as printed circuit boards and/or hard disk drives. Although the illustrated embodiment shows the enclosure 10 being substantially rectangular shaped, other configurations, shapes, or structures may be utilized. In this exemplary embodiment, the enclosure 10 includes a bottom wall 12 configured with a plurality of positioning posts 14 perpendicularly protruding from an outer surface 121 of the bottom wall 12. In this embodiment, the plurality of positioning posts 14 are located along an imaginary circle C1.

Figure 2:
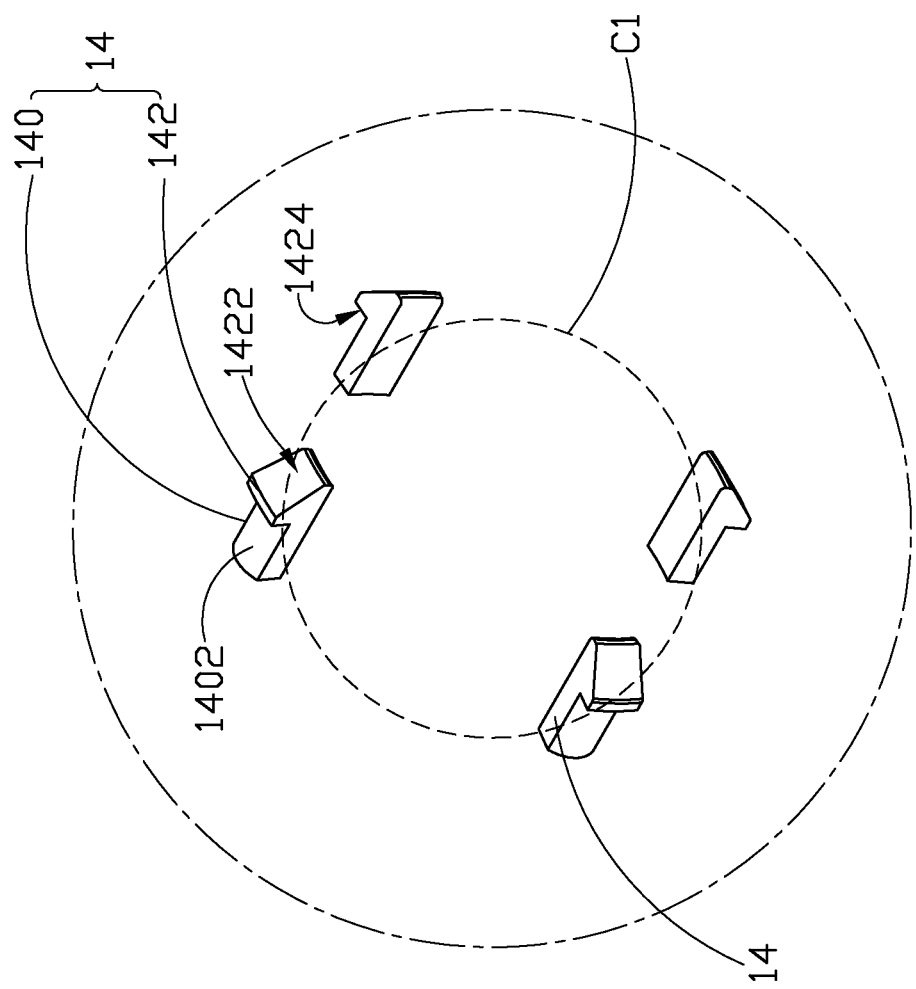
FIG. 2 is an enlarged view of an area, labeled II, of FIG. 1.

Referring to FIG. 2, each positioning post 14 comprises a base 140 and a hook 142. The base 140 connects between the hook 142 and the outer surface 121 of the bottom wall 12, and comprises an engaging portion 1402 used to engage the fixing member 30 to position the enclosure 10. The hook 142 is configured on a free end of the base 140 and comprises a fixing surface 1424 and a top bevel surface 1422. The fixing surface 1424 faces the bottom wall 12 and is used to position the fixing member 30 to the enclosure 10. The top bevel surface 1422 is configured on an end of the hook 142 away from the bottom wall 12 relative to the fixing surface 1424. In this embodiment, the fixing surface 1424 is parallel with the bottom wall 12.

Figure 3:
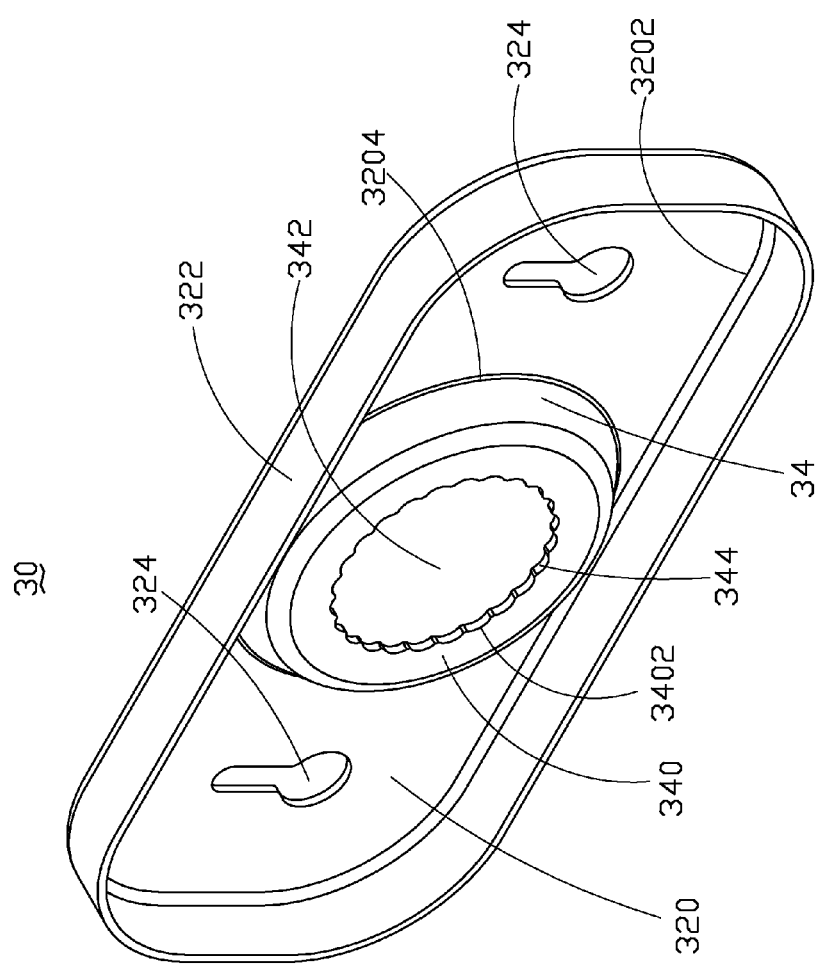
FIG. 3 is a perspective view of a fixing element of the electronic device of FIG. 1.
Figure 4:
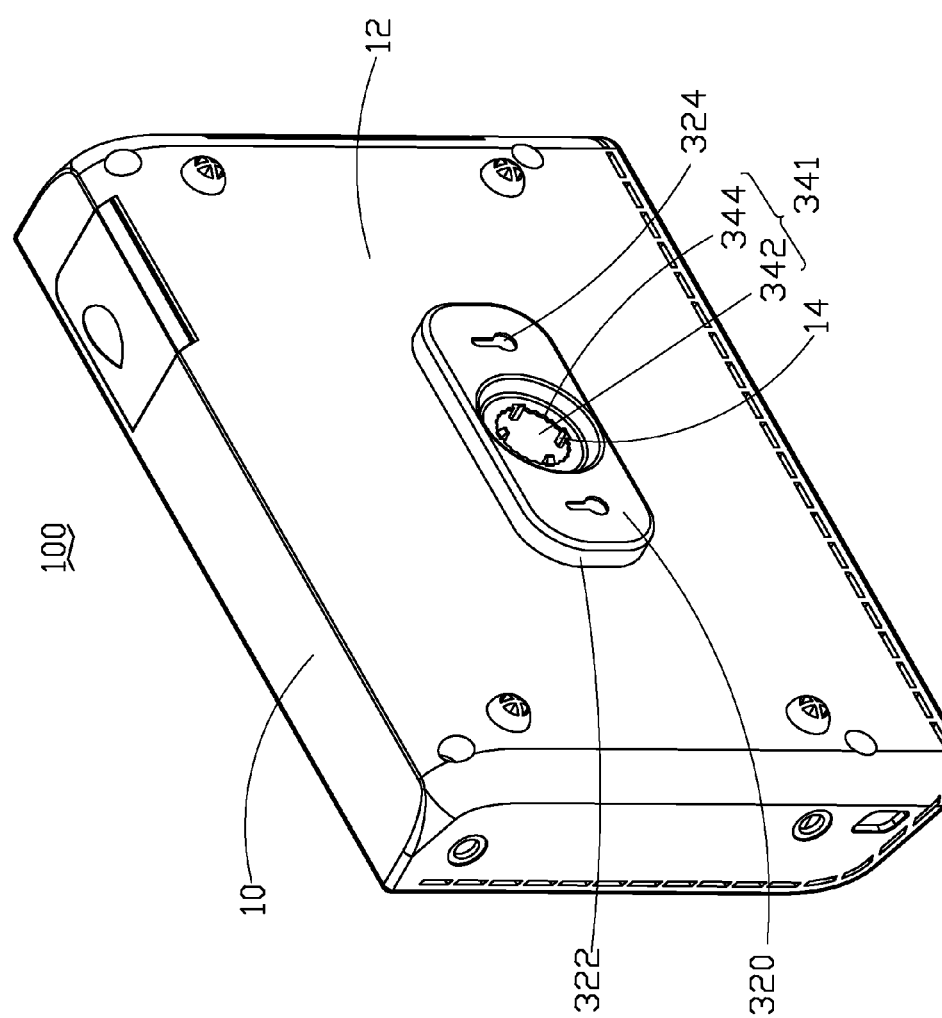
FIG. 4 is an assembled view of FIG. 1.

Referring to FIG. 3, the fixing member 30 is attached to the bottom wall 12 and used to fix the enclosure 10 on a wall or other surfaces (not shown). The fixing member 30 comprises a fixing portion 32 and an adjusting portion 34. The fixing portion 32 comprises a fixing plate 320 and a side wall 322 perpendicularly extending from the fixing plate 320 to support the fixing plate 320 on the bottom wall 12 of the enclosure 10, as shown in FIG. 4. The side wall 322 extends from an outer edge 3202 of the fixing plate 320. The adjusting portion 34 is configured on an inner edge 3204 of the fixing plate 320. The fixing plate 320 defines two through holes 324 used to fix the enclosure 10 on the wall (not shown).

The adjusting portion 34 is integrated with the fixing plate 320. The adjusting portion 34 and the side wall 322 extend from the fixing plate 320 in a same direction. The adjusting portion 34 comprises a positioning portion 340 surrounded by the side wall 322. In this embodiment, the adjusting portion 34 is disposed between the two through holes 324 and substantially located at a center of the fixing member 30. The adjusting portion 34 defines an engaging hole 342 engageable with the positioning posts 14. The positioning portion 340 defines a plurality of positioning teeth 344 configured on an inner edge 3402 of the positioning portion 340 and engageable with the engaging portions 1402 of the base 140. That is, the plurality of positioning teeth 344 entirely surround and communicate with the engaging hole 342. Referring to FIG. 4, the plurality of positioning teeth 344 and the engaging hole 342 cooperatively form a passageway 341 through which the plurality of positioning posts 14 pass and engage with the plurality of positioning teeth 344 to position the fixing member 30 on the enclosure 10. Due to friction between the positioning teeth 344 of the positioning portion 340 and the engaging portions 1402 of the base 140 as well as tight attachment of the fixing surface 1424 of the hook 142 to the positioning portion 340, the enclosure 10 can be positioned at different angles relative to the fixing member 30. In this embodiment, the positioning teeth 344 and engaging portions 1402 are both arc-shaped, and the plurality of positioning teeth 344 are contiguously arranged as well as contiguously connected with each other and used to receive the engaging portions 1402 of the positioning posts 14.

Referring to FIG. 4, in assembly, the positioning posts 14 pass through the engaging hole 342 to position the positioning portion 340 between the bottom wall 12 and the hook 142, thereby the fixing member 30 being attached to the enclosure 10. In this embodiment, there is a little distortion toward the bottom wall 12 existing in the positioning portion 340 under the force of the hook 142, so that the fixing surface 1424 of the hook 142 tightly attach to the positioning portion 340, which prevents rocking of the enclosure 10 relative to the fixing member 30. Each of the engaging portions 1402 of the positioning posts 14 engages with one of the plurality of positioning teeth 344 to position the enclosure 10 to the fixing member 30.

When the enclosure 10 is rotated relative to the fixing member 30, the positioning posts 14 move in the engaging hole 342 to make the engaging portions 1402 engage different positioning teeth 344 due to flexibility of the positioning posts 14. Therefore, the enclosure 10 is positioned to the fixing member 30, in different angles relatively, providing various requirements for users.

While an embodiment of the present disclosure has been described above, it should be understood that it has been presented by way of example only and not by way of limitation. Thus the breadth and scope of the present disclosure should not be limited by the above-described embodiments, but should be defined only in accordance with the following claims and their equivalents.

What is claimed is:

1. An electronic device, comprising:
   an enclosure, comprising a bottom wall configured with a plurality of positioning posts perpendicularly protruding from an outer surface of the bottom wall, each of the positioning posts comprising a hook and a base connecting between the hook and the bottom wall; and a fixing member, attached to the bottom wall and comprising a positioning portion defining an engaging hole and a plurality of positioning teeth continuously connected with each other and configured on an inner edge of the positioning portion and engageable with the base, the plurality of positioning teeth entirely surrounding and communicating with the engaging hole;

wherein the enclosure is configured to be positioned at different angles relative to the fixing member due to friction between the positioning teeth of the positioning portion and the base as well as tight attachments of the hooks to the positioning portion.

2. The electronic device as recited in claim 1, wherein the plurality of positioning posts are located along an imaginary circle.

3. The electronic device as recited in claim 2, wherein each of the bases of the positioning posts comprises an engaging portion used to engage the positioning teeth, where the positioning teeth and the engaging portions are both arc-shaped.

4. The electronic device as recited in claim 1, wherein each of the hooks comprises a fixing surface facing the bottom wall and a top bevel surface configured on an end of the hook away from the bottom wall relative to the fixing surface, each of the fixing surfaces tightly attaches to the positioning portion.

5. The electronic device as recited in claim 4, wherein each of the fixing surfaces is parallel with the bottom wall.

6. The electronic device as recited in claim 1, wherein the fixing member comprises a fixing portion and an adjusting portion, the fixing portion comprises a fixing plate and a side wall perpendicularly extending from an outer edge of the fixing plate to support the fixing plate on the bottom wall, the adjusting portion is integrated with the fixing plate and configured on an inner edge of the fixing plate, and the positioning portion is configured as a part of the adjusting portion and surrounded by the side wall.

7. An electronic device, comprising:
an enclosure, comprising a bottom wall configured with a plurality of positioning posts perpendicularly protruding from an outer surface of the bottom wall, each of the positioning posts comprising a hook and a base connecting between the hook and the bottom wall, each of the bases comprising an engaging portion; and
a fixing member, attached to the bottom wall and comprising a positioning portion defining an engaging hole and a plurality of positioning teeth continuously connected with each other and entirely surrounding the engaging hole, the plurality of positioning teeth communicating with the engaging hole and used to receive the plurality of engaging portions to position the enclosure at different angles relative to the fixing member.

8. The electronic device as recited in claim 7, wherein the plurality of positioning posts are located along an imaginary circle.

9. The electronic device as recited in claim 8, wherein the positioning teeth and the engaging portions are both arc-shaped.

10. The electronic device as recited in claim 7, wherein each of the hooks comprises a fixing surface facing the bottom wall and a top bevel surface configured on an end of the hook away from the bottom wall relative to the fixing surface, each of the fixing surfaces tightly attaches to the positioning portion.

11. The electronic device as recited in claim 10, wherein each of the fixing surfaces is parallel with the bottom wall.

12. The electronic device as recited in claim 7, wherein the fixing member comprises a fixing portion and an adjusting portion, the fixing portion comprises a fixing plate and a side wall perpendicularly extending from an outer edge of the fixing plate to support the fixing plate on the bottom wall, the adjusting portion is integrated with the fixing plate and configured on an inner edge of the fixing plate, and the positioning portion is located on the adjusting portion and surrounded by the side wall.

13. An electronic device, comprising: an enclosure, comprising a bottom wall configured with a plurality of positioning posts perpendicularly protruding from an outer surface of the bottom wall; and
a fixing member, attached to the bottom wall and comprising a fixing portion and an adjusting portion, the fixing portion comprising a fixing plate defining two through holes used to fix the enclosure on a wall and a side wall perpendicularly extending from an outer edge of the fixing plate,
the adjusting portion comprising a positioning portion surrounded by the side wall, the positioning portion defining an engaging hole and a plurality of positioning teeth continuously connected with each other and entirely surrounding and communicating with the engaging hole; and
the plurality of positioning teeth is configure to receive the plurality of positioning posts to position the enclosure at different angles relative to the fixing member.

14. The electronic device as recited in claim 13, wherein the plurality of positioning posts are located along an imaginary circle.

15. The electronic device as recited in claim 14, wherein each of the positioning posts comprises a hook and a base connecting between the hook and the bottom wall, each of the bases comprises an engaging portion, when the enclosure is positioned to the fixing member, the engaging portions are respectively received in the plurality of positioning teeth.

16. The electronic device as recited in claim 15, wherein each of the hooks comprises a fixing surface facing the bottom wall and a top bevel surface configured on an end of the hook away from the bottom wall relative to the fixing surface, each of the fixing surfaces tightly attaches to the positioning portion.

17. The electronic device as recited in claim 16, wherein each of the fixing surfaces is parallel with the bottom wall.

* * * * *